US009419576B2

(12) United States Patent
Lin

(10) Patent No.: US 9,419,576 B2
(45) Date of Patent: Aug. 16, 2016

(54) ELECTRONIC DEVICE AND METHOD FOR REPRODUCING AUDIO SIGNALS

(71) Applicant: Chiun Mai Communication Systems, Inc., New Taipei (TW)

(72) Inventor: Chih-Ta Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 197 days.

(21) Appl. No.: 14/056,982

(22) Filed: Oct. 18, 2013

(65) Prior Publication Data

US 2014/0341393 A1 Nov. 20, 2014

(30) Foreign Application Priority Data

May 20, 2013 (TW) .............................. 102117695 A

(51) Int. Cl.
*H03G 5/00* (2006.01)
*H03G 9/02* (2006.01)
*H03G 9/00* (2006.01)

(52) U.S. Cl.
CPC ............... *H03G 9/025* (2013.01); *H03G 9/005* (2013.01)

(58) Field of Classification Search
CPC ........... H04R 3/04; H03G 5/04; H03G 5/165; H03G 5/025; H03G 5/005
See application file for complete search history.

(56) References Cited

U.S. PATENT DOCUMENTS

| | | | | |
|---|---|---|---|---|
| 6,111,960 A * | 8/2000 | Aarts | ........................ | H04R 3/00 381/61 |
| 7,778,718 B2 * | 8/2010 | Janke | ........................ | H04R 3/04 375/229 |
| 8,094,835 B2 * | 1/2012 | Shimura | ................... | H03G 5/16 381/101 |
| 2005/0233695 A1 * | 10/2005 | Cho | ............................. | 455/13.4 |
| 2012/0008788 A1 * | 1/2012 | Jonsson et al. | ................... | 381/17 |

* cited by examiner

*Primary Examiner* — Simon Sing
(74) *Attorney, Agent, or Firm* — ScienBiziP, P.C.

(57) ABSTRACT

In a method of reproducing audio signals using an electronic device, the electronic device decodes an audio file to generate original digital audio signals, and attenuates the original digital audio signals having frequencies that are lower than a preset cutoff frequency. The electronic device further amplifies each of attenuated digital audio signals and the original digital audio signals having frequencies that are higher than the preset cutoff frequency with a preset gain. Once the electronic device converts the amplified digital audio signals into analog audio signals, and outputs the analog audio signals to an audio amplifier, the audio amplifier amplifies the analog audio signals to drive a speaker to output the analog audio signals.

9 Claims, 3 Drawing Sheets

ELECTRONIC DEVICE AND METHOD FOR REPRODUCING AUDIO SIGNALS

BACKGROUND

1. Technical Field

Embodiments of the present disclosure relates to audio signals reproduction technology, and more particularly to an electronic device and a method for reproducing the audio signals using the electronic device.

2. Description of Related Art

An electronic device (e.g., a mobile phone) outputs audio signals with small volume, as the size of a speaker of the electronic device becomes more and more smaller. Generally, manufactures use the Auto Gain Control (AGC) mechanism to increase the volume. However, the volume may fluctuate the AGC mechanism is used. Therefore, there is room for improvement in the art.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

In general, the word module, as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
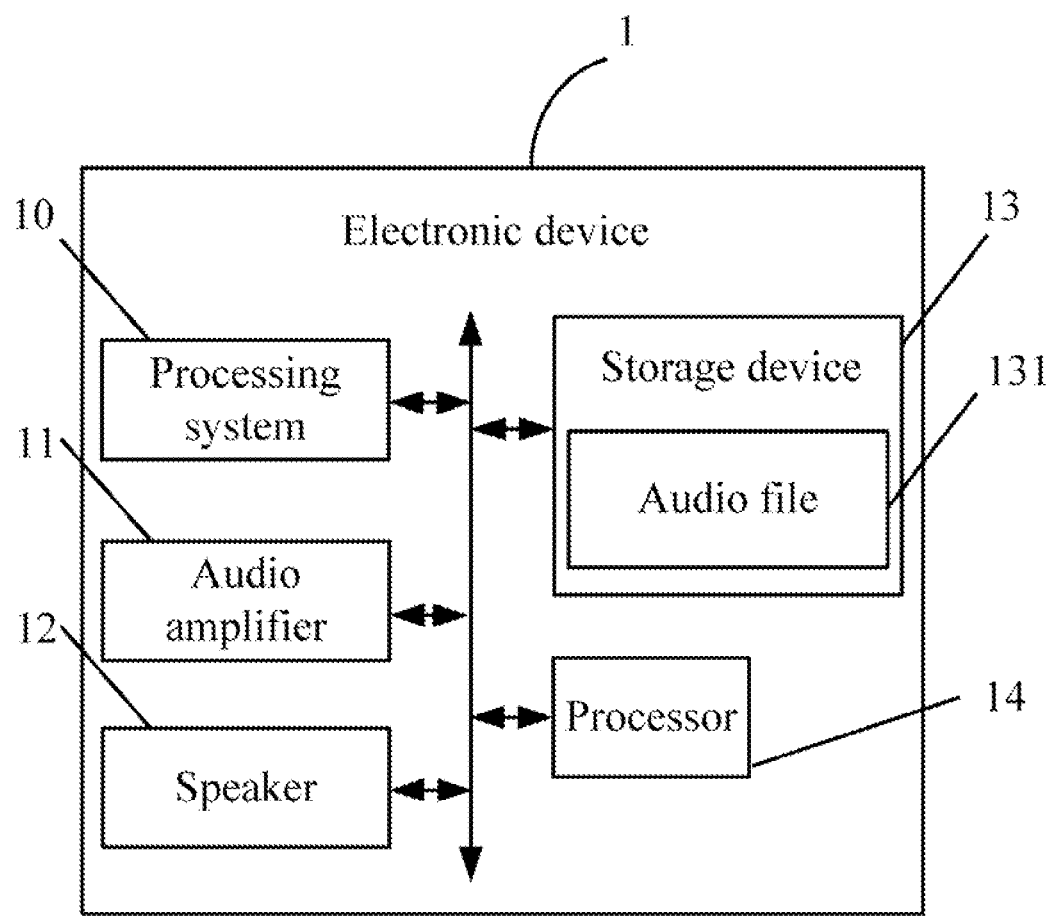
FIG. 1 is a block diagram of one embodiment of an electronic device including a processing system.

FIG. 1 is a block diagram of one embodiment of an electronic device 1 including a processing system 10. In this embodiment, the electronic device 1 further includes an audio amplifier 11, a speaker 12, a storage device 13, and at least one processor 14.

In one embodiment, the audio amplifier 11 is a Class-D amplifier. The processing system 10 prestores an audio file 131 in the storage device 13. The processing system 10 processes the audio file 131 to generate analog audio signals. The audio amplifier 11 amplifies the analog audio signals to drive the speaker 12 to output the analog audio signals. Details will be given below.

Figure 2:
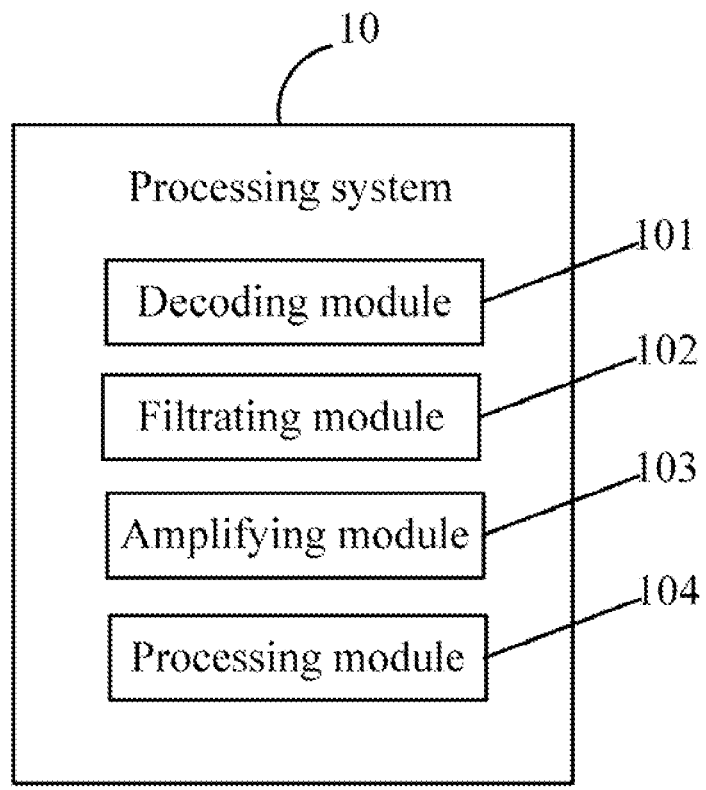
FIG. 2 is a block diagram of function modules of the processing system included in the electronic device of FIG. 1.

FIG. 2 is a block diagram of function modules of the processing system 10 included in the electronic device 1 of FIG. 1. In this embodiment, the processing system 10 may include a decoding module 101, a filtrating module 102, an amplifying module 103, and a processing module 104. The modules 101-104 comprise computerized codes in the form of one or more programs that may be stored in the storage device 13. The computerized code includes instructions that are executed by the at least one processor 14.

Figure 3:
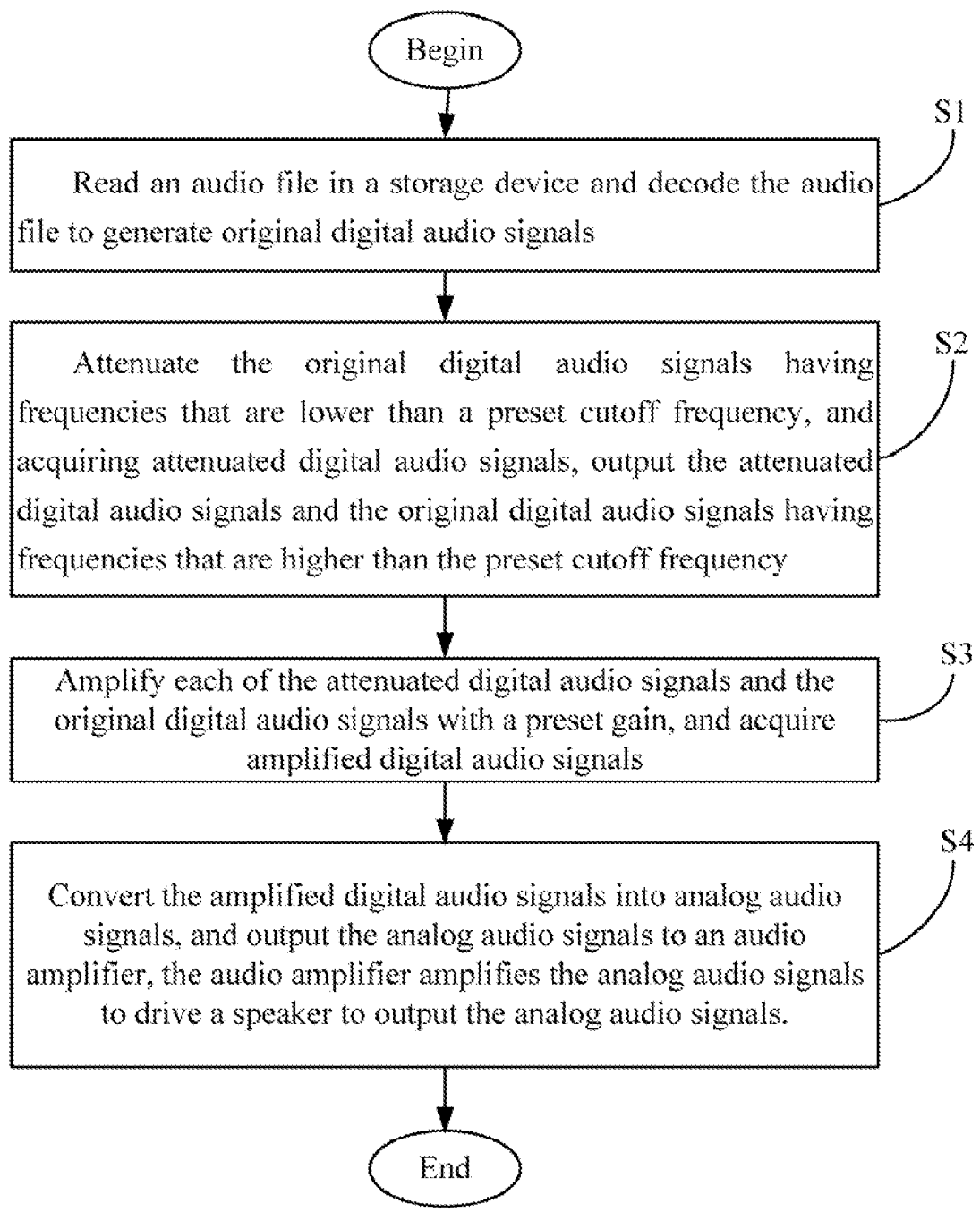
FIG. 3 is a flowchart of one embodiment of a processing method to reproduce audio signals using the electronic device of FIG. 1.

FIG. 3 is a flowchart of one embodiment of processing method to reproducing audio signals using the electronic device 1. Depending on the embodiment, additional steps may be added, others deleted, and the ordering of the steps may be changed.

In step S1, the decoding module 101 reads the audio file 131 in the storage device 13, and decodes the audio file 131 to generate original digital audio signals.

In step S2, the filtrating module 102 attenuates the original digital audio signals having frequencies that are lower than a preset cutoff frequency, and acquires attenuated digital audio signals. The filtrating module 102 further outputs the attenuated digital audio signals and the original digital audio signals having frequencies that are higher than the preset cutoff frequency.

In this embodiment, the preset cutoff frequency may be within a range of [600 HZ, 1000 HZ]. For example, the preset cutoff frequency is 600 HZ, then the filtrating module 102 attenuates the original digital audio signals having frequencies that are lower than 600 HZ and acquires the attenuated digital audio signals. The filtrating module 102 further outputs the attenuated digital audio signals and the original digital audio signals having frequencies that are higher than 600 HZ.

In step S3, the amplifying module 103 amplifies each of the attenuated digital audio signals and the original digital audio signals with a preset gain, and acquires amplified digital audio signals.

In one embodiment, the preset gain is equal to a sound intensity difference between a standard audio signal and a signal having the greatest sound intensity among the attenuated digital audio signals and the original digital audio signals. In one embodiment, an sound intensity of the standard audio signal is equal to about 0 dB.

For example, an sound intensity of the signal having the greatest sound intensity is equal to about −20 dB, then the preset gain is equal to the sound intensity difference (about 20 dB) between the standard audio signal and the signal having the greatest sound intensity.

Then, the amplifying module 103 amplifies each of the attenuated digital audio signals and the original digital audio signals with about 20 dB, and acquires amplified digital audio signals. For example, an sound intensity of a first digital audio signal among the attenuated digital audio signals and the original digital audio signals is about −50 dB, and the amplifying module 103 acquires a first amplified digital audio signal having the sound intensity (about −30 dB) after the amplifying module 103 amplifies the first digital audio signal with about 20 dB.

In another example, an sound intensity of a second digital audio signal among the attenuated digital audio signals and the original digital audio signals is about −30 dB, and the amplifying module 103 acquires a second amplified digital audio signal having the sound intensity (about −10 dB) after the amplifying module 103 amplifies the second digital audio signal with about 20 dB.

In step S4, the processing module 104 converts the amplified digital audio signals into analog audio signals, and outputs the analog audio signals to the audio amplifier 11, the audio amplifier 11 amplifies the analog audio signals to drive the speaker 12 to output the analog audio signals.

When the frequency of the digital audio signal is higher, the sound intensity of the digital audio signal is smaller. From the step S2 of the present disclosure, sound intensity differences between the digital audio signals having frequencies that are lower than the cutoff frequency and the digital audio signals having frequencies that are higher than the cutoff frequency become smaller when the filtrating module 102 attenuates the sound intensity of original audio signals having frequencies that are lower than the preset cutoff frequency.

That is, a volume of the speaker 12 does not fluctuate when the sound intensity differences become smaller. Further, because of the amplifying module 13 amplifies each of the attenuated digital audio signals and the original digital audio signals having frequencies that are higher than the cutoff frequencies with the preset gain, the volume of the speaker is further increased.

Although embodiments of the present disclosure have been specifically described, the present disclosure is not to be construed as being limited thereto. Various changes or modifications may be made to the present disclosure without departing from the scope and spirit of the present disclosure.

What is claimed is:

1. A method for reproducing audio signals using an electronic device, the electronic device comprising an audio amplifier, a speaker, a storage device, and at least one processor, the method comprising:
    decoding an audio file stored in the storage device to generate original digital audio signals;
    attenuating the original digital audio signals having frequencies that are lower than a preset cutoff frequency and acquiring attenuated digital audio signals, outputting the attenuated digital audio signals and the original digital audio signals having frequencies that are higher than the preset cutoff frequency;
    amplifying each of the attenuated digital audio signals and the original digital audio signals with a preset gain and acquiring amplified digital audio signals, wherein the preset gain is equal to a sound intensity difference between a standard audio signal and a signal having the greatest sound intensity among the attenuated digital audio signals and the original digital audio signals, wherein an sound intensity of the standard audio signal is equal to 0 dB; and
    converting all the amplified digital audio signals into analog audio signals, and outputting all the analog audio signals to the audio amplifier, the audio amplifier amplifying the analog audio signals to drive the speaker to output the analog audio signals.

2. The method of claim 1, wherein the preset cutoff frequency is greater than or equal to 600 HZ and less than or equal to 1000 HZ.

3. The method of claim 1, wherein the audio amplifier is a Class-D amplifier.

4. An electronic device, comprising:
    an audio amplifier;
    a speaker;
    at least one processor; and
    a storage device storing a plurality of instructions, which when executed by the processor, causes the processor to:
    decoding an audio file stored in the storage device to generate original digital audio signals;
    attenuate the original digital audio signals having frequencies that are lower than a preset cutoff frequency and acquiring attenuated digital audio signals, outputting the attenuated digital audio signals and the original digital audio signals having frequencies that are higher than the preset cutoff frequency;
    amplify each of the attenuated digital audio signals and the original digital audio signals with a preset gain and acquiring amplified digital audio signals, wherein the preset gain is equal to a sound intensity difference between a standard audio signal and a signal having the greatest sound intensity among the attenuated digital audio signals and the original digital audio signals, wherein an sound intensity of the standard audio signal is equal to 0 dB; and
    convert all the amplified digital audio signals into analog audio signals, and outputting all the analog audio signals to the audio amplifier, the audio amplifier amplifying the analog audio signals to drive the speaker to output the analog audio signals.

5. The method of claim 4, wherein the preset cutoff frequency is greater than or equal to 600 HZ and less than or equal to 1000 HZ.

6. The method of claim 4, wherein the audio amplifier is a Class-D amplifier.

7. A non-transitory storage medium having stored thereon instructions that, when executed by a processor of an electronic device, causes the electronic device to perform a method for reproducing audio signals, the electronic device comprising an audio amplifier, a speaker, and a storage device, the method comprising:
    decoding an audio file stored in the storage device to generate original digital audio signals;
    attenuating the original digital audio signals having frequencies that are lower than a preset cutoff frequency and acquiring attenuated digital audio signals, outputting the attenuated digital audio signals and the original digital audio signals having frequencies that are higher than the preset cutoff frequency;
    amplifying each of the attenuated digital audio signals and the original digital audio signals with a preset gain and acquiring amplified digital audio signals, wherein the preset gain is equal to a sound intensity difference between a standard audio signal and a signal having the greatest sound intensity among the attenuated digital audio signals and the original digital audio signals, wherein an sound intensity of the standard audio signal is equal to 0 dB; and
    converting all the amplified digital audio signals into analog audio signals, and outputting all the analog audio signals to the audio amplifier, the audio amplifier amplifying the analog audio signals to drive the speaker to output the analog audio signals.

8. The method of claim 7, wherein the preset cutoff frequency is greater than or equal to 600 HZ and less than or equal to 1000 HZ.

9. The method of claim 7, wherein the audio amplifier is a Class-D amplifier.

* * * * *